United States Patent
Annapragada

(12) 
(10) Patent No.: US 6,413,877 B1
(45) Date of Patent: Jul. 2, 2002

(54) METHOD OF PREVENTING DAMAGE TO ORGANO-SILICATE-GLASS MATERIALS DURING RESIST STRIPPING

(75) Inventor: Rao Annapragada, Union City, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/746,901

(22) Filed: Dec. 22, 2000

(51) Int. Cl.[7] ............. H01L 21/302; H01L 21/461; H01L 21/31
(52) U.S. Cl. ............ 438/723; 438/694; 438/710; 438/725; 438/758; 438/787
(58) Field of Search .................. 438/694, 710, 438/723, 725, 758, 787

(56) References Cited

U.S. PATENT DOCUMENTS 5,801,077 A  9/1998 Chor et al. ............... 438/305
5,827,782 A * 10/1998 Shih ........................ 438/697
5,846,884 A * 12/1998 Naeem et al. ............. 438/714

\* cited by examiner

*Primary Examiner*—Alexander G. Ghyka
(74) *Attorney, Agent, or Firm*—Beyer Weaver & Thomas, LLP

(57) ABSTRACT

A method for making an etched organo-silicate-glass (OSG) layer over a substrate is provided. Generally an OSG layer is placed over the substrate. A patterned resist mask is placed over the OSG layer. The OSG layer is then etched, where the etching of the OSG layer forms at least one opening in the OSG layer and sidewall within the at least one opening. The patterned resist mask is then stripped by a plasma. A wet stripping is then used to remove the sidewalls. An antireflective coating may be placed between the resist and the OSG layer. In addition, an etched organo-silicate-glass (OSG) layer is provided. Generally an OSG layer is placed over the substrate. A patterned resist mask is placed over the OSG layer. The OSG layer is then etched, where the etching of the OSG layer forms at least one opening in the OSG layer and sidewall within the at least one opening. The patterned resist mask is then stripped by a plasma. A wet stripping is then used to remove the sidewalls.

18 Claims, 4 Drawing Sheets

METHOD OF PREVENTING DAMAGE TO ORGANO-SILICATE-GLASS MATERIALS DURING RESIST STRIPPING

BACKGROUND OF THE INVENTION

The present invention relates to the fabrication of semiconductor-based devices. More particularly, the present invention relates to improved techniques for fabricating semiconductor-based devices with organo-silicate-glass.

In semiconductor-based device (e.g., integrated circuits or flat panel displays) manufacturing, dual damascene structures may be used in conjunction with copper conductor material to reduce the RC delays associated with signal propagation in aluminum based materials used in previous generation technologies. In dual damascene, instead of etching the conductor material, vias, and trenches may be etched into the dielectric material and filled with copper. The excess copper may be removed by chemical mechanical polishing (CMP) leaving copper lines connected by vias for signal transmission. To reduce the RC delays even further, low dielectric constant materials may be used. These low dielectric constant materials may include organo-silicate-glass (OSG) materials, such as Coral™ and Black Diamond™. OSG materials may be silicon dioxide doped with organic components such as methyl groups. OSG materials have carbon and hydrogen atoms incorporated into a silicon dioxide lattice, which lowers the dielectric constant of the material. However OSG materials may be susceptible to damage when exposed to oxygen, $H_2$, and $NH_3$ gases, which are used for stripping photo resist. To facilitate discussion FIG. 1 is a flow chart of an etching process of OSG materials used in the prior art. FIGS. 2A–C are schematic side views of an etched OSG according to the process of FIG. 1. An OSG layer 204 may be deposited on a substrate 208 (step 104), as shown in FIG. 2A. The substrate 208 may be a silicon wafer or another type of material or may be part of a layer over a wafer. An antireflective coating (ARC) 212 may be deposited over the OSG layer 204 (step 108). A patterned resist mask 216 may be placed over the ARC 212 (step 112). The patterned resist mask 216 has an aperture 220. The substrate 208 may be placed in an etching chamber where the OSG layer 204 is etched (step 116). A plasma dry etch may be used to etch the OSG layer 204, which forms an opening 224 under the aperture 220 in the patterned resist mask 216, as shown in FIG. 2B. Some of the patterned resist mask 216 is removed during the OSG layer etch. In addition, sidewalls 228 may be formed within the opening 224. The patterned resist mask 216 and sidewalls 228 would be simultaneously stripped (step 120). One way of simultaneously stripping the patterned resist mask 216 and sidewalls 228 is by exposing the patterned resist mask 216 to a plasma with a $CF_4$ (or another fluorocarbon) and $N_2/O_2$, $N_2/H_2$, or $N_2/NH_3$ etchant gas. The plasma would strip both the patterned resist mask 216 and the sidewalls 228, as shown in FIG. 2C.

OSG materials may be very susceptible to damage due to the removal of organic content by exposure to the plasma used to strip the resist and sidewalls. The plasma may diffuse a few hundred angstroms into the OSG layer and cause damage 240 to the OSG layer bordering the opening 224. The ARC 212 may protect the upper OSG layer 204. Part of the damage caused by the plasma is the removal of carbon and hydrogen from the damage area causing the OSG to be more like silicon dioxide, which has a higher dielectric constant. Damage may be quantified by measuring the change in SiC/SiO ratio of the OSG layer from FTIR analysis. A decrease of 1% in SiC/SiO ratio on a blanket film of a 1 micron thickness could be very significant as the damage is limited to a few hundred angstroms on the top layer of the blanket film. When translated to the trench side wall that means a damage of a few hundred angstroms on each side of a 2000 Å trench wall.

It is desirable to reduce damage to the OSG layer.

SUMMARY OF THE INVENTION

To achieve the foregoing and other objects and in accordance with the purpose of the present invention for making an etch organo-silicate-glass (OSG) layer over a substrate is provided. Generally an OSG layer is placed over the substrate. A patterned resist mask is placed over the OSG layer. The OSG layer is then etched, where the etching of the OSG layer forms at least one opening in the OSG layer and sidewall within the at least one opening. The patterned resist mask is then stripped by a plasma. A wet stripping is then used to remove the sidewalls.

In addition, the present invention provides an etched organo-silicate-glass (OSG) layer. Generally an OSG layer is placed over the substrate. A patterned resist mask is placed over the OSG layer. The OSG layer is then etched, where the etching of the OSG layer forms at least one opening in the OSG layer and sidewall within the at least one opening. The patterned resist mask is then stripped by a plasma. A wet stripping is then used to remove the sidewalls.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
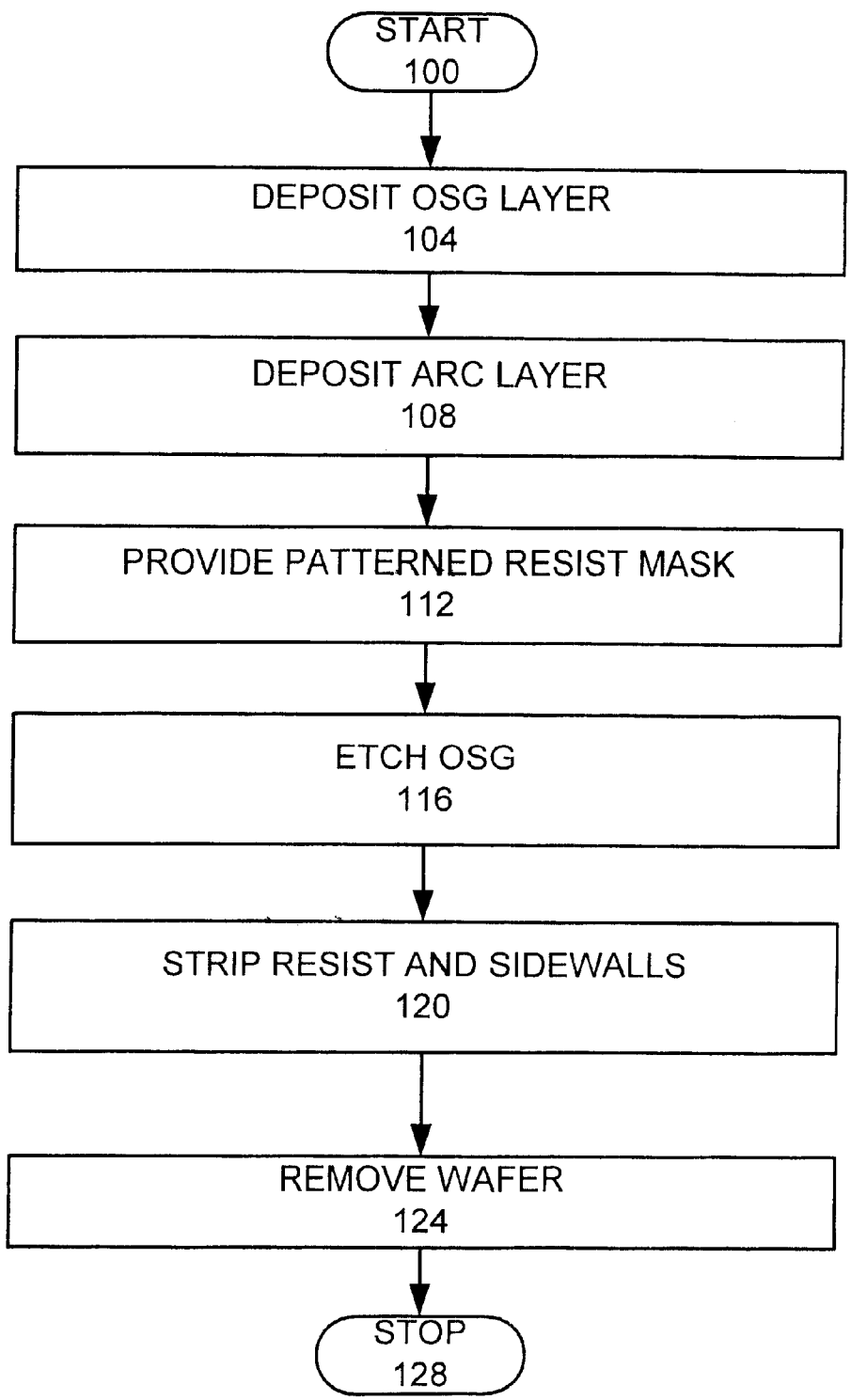
FIG. 1 is a flow chart of an etching process of OSG materials used in the prior art.
Figure 2A:
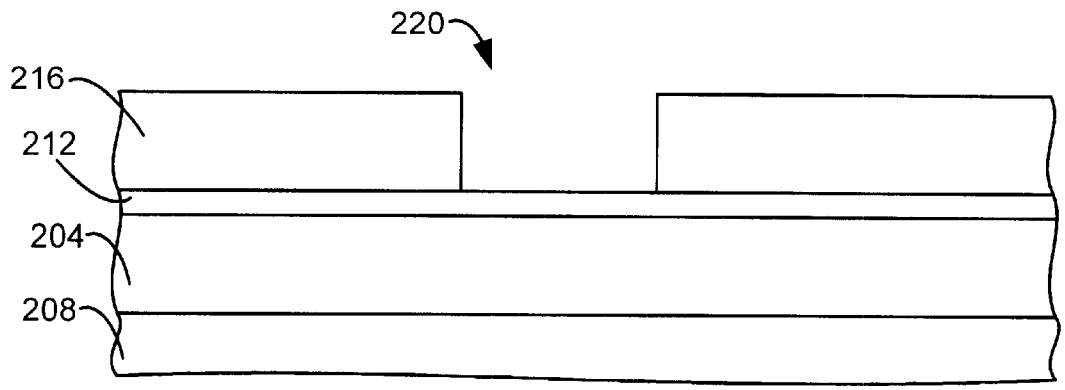
FIGS. 2A–C are schematic side views of an etched OSG according to the process of FIG. 1.
Figure 2B:
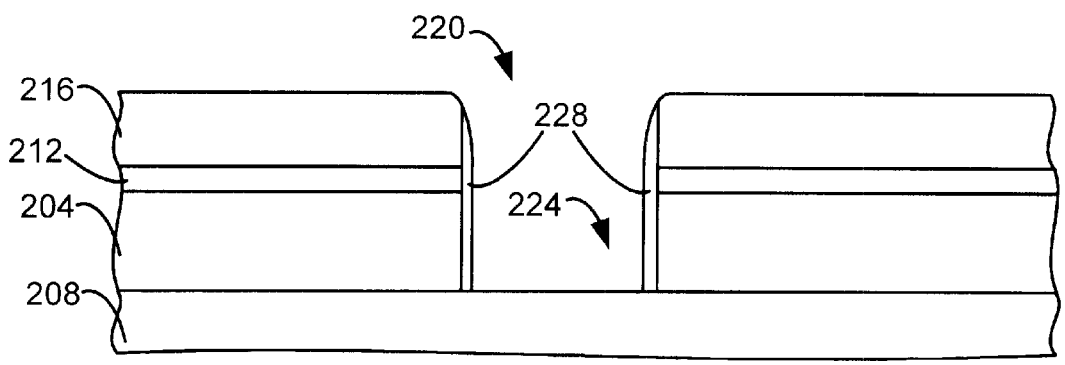
Figure 2C:
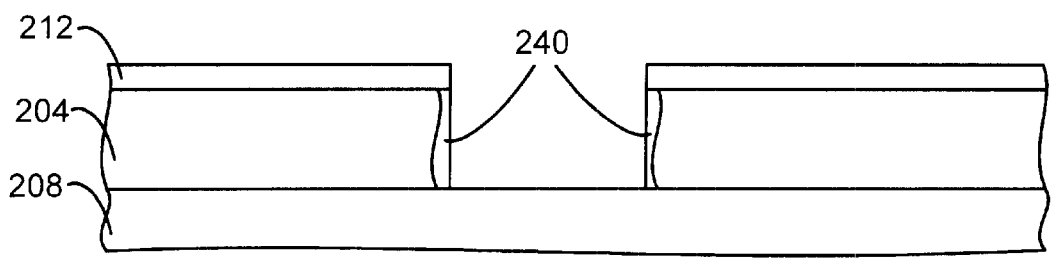
Figure 3:
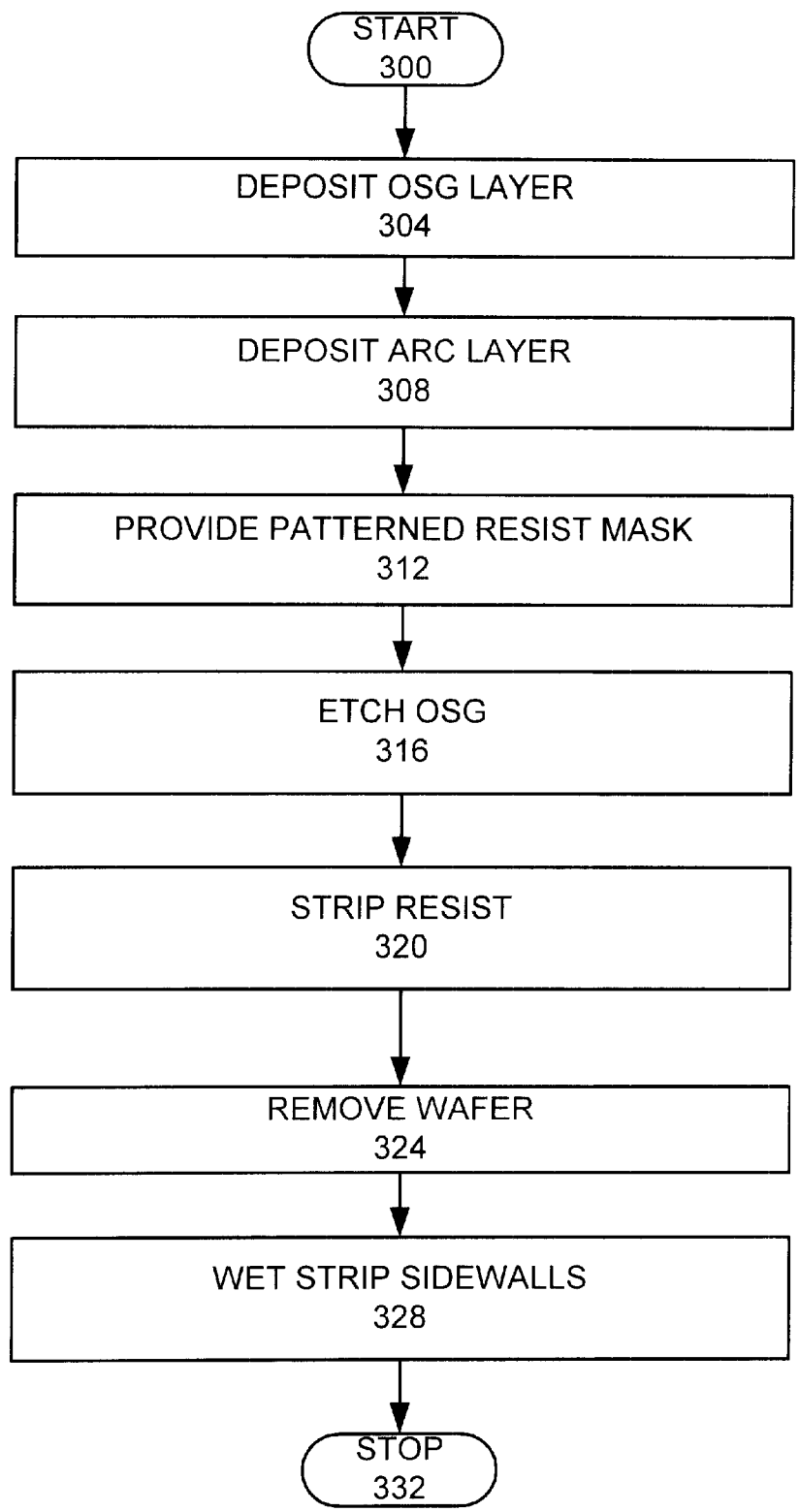
FIG. 3 is a flow chart of an etching process of OSG materials used in a preferred embodiment of the invention.
Figure 4A:
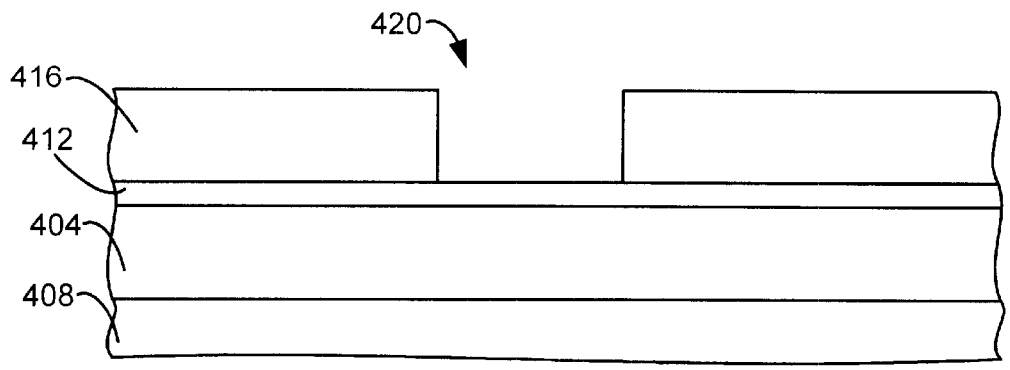
FIGS. 4A–D are schematic side views of an etched OSG according to the process of FIG. 3.
Figure 4B:
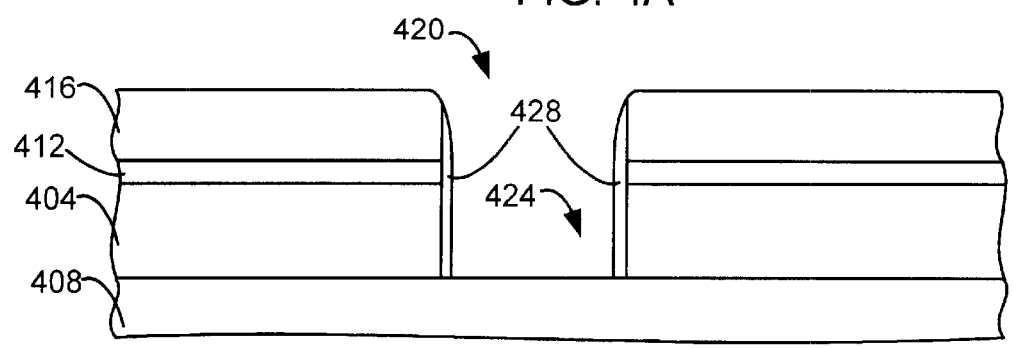
Figure 4C:
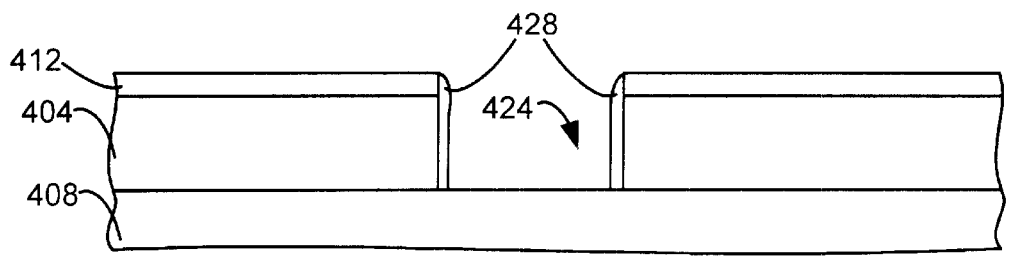
Figure 4D:
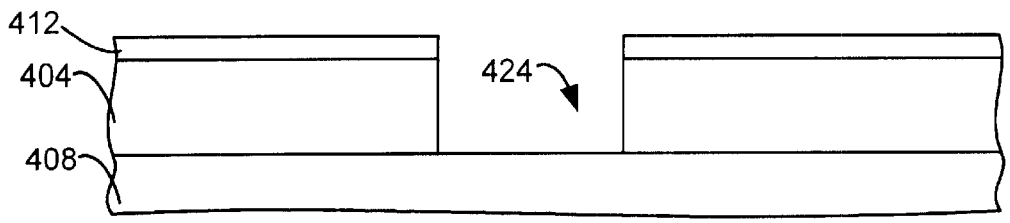

To facilitate discussion, FIG. 3 is a flow chart of an etching process of OSG materials used in a preferred embodiment of the invention. FIGS. 4A–C are schematic side views of an etched OSG according to the process of FIG. 3. An OSG layer 404 may be deposited on a substrate 408 (step 304), as shown in FIG. 4A. The substrate 308 may be a silicon wafer or another type of material or may be part of a layer over a wafer. An antireflective coating (ARC) 412 may be deposited over the OSG layer 404 (step 308). The antireflective coating (ARC) 412 may be an organic bottom antireflective coating (BARC) or an inorganic dielectric antireflective coating (DARC). A patterned resist mask 416 may be placed over the ARC 412 (step 312). The patterned resist mask 416 has an aperture 420. The patterned resist mask may be formed by placing a layer of photo resist, which is exposed to a light pattern and then etched. Other methods of forming a patterned resist mask may be used. The substrate 408 may be placed in an etching chamber where the OSG layer 404 is etched (step 316). A plasma dry etch may be used to etch the OSG layer 404, which forms an opening 424 under the aperture 420 in the patterned resist mask 416, as shown in FIG. 4B. Some of the patterned resist mask 416 is removed during the OSG layer etch. In addition, sidewalls 428 may be formed within the opening 424. The patterned resist mask 416 is stripped without stripping the sidewalls 428 (step 320). One way of stripping the patterned resist mask 416 without stripping the side walls 428 is by placing the wafer in a medium density plasma chamber and exposing the patterned resist mask 416 to a medium density plasma with an $N_2/O_2$, $N_2/H_2$, or $N_2/NH_3$ etchant gas without a fluorocarbon, such as $CF_4$. The resist patterned resist mask 416 is stripped down to the ARC 412 without stripping the sidewalls 428, as shown in FIG. 4C. The wafer is then removed from the plasma chamber (step 324) and placed in a wet bath where the sidewalls 428 are stripped using a wet etch (step 328), as shown in FIG. 4D.

By not stripping the sidewalls 428 during the plasma stripping of the patterned resist mask 416 the plasma is kept away from the surface of the OSG layer 404. Since plasma is kept away from the surface of the OSG layer 404, the OSG layer 404 is not damaged by the plasma. It has been found by experiment that the sidewalls (sidewall polymer) can act as an effective barrier for preventing diffusion of plasma species to the OSG layer during resist strip. It has also been found by experiment that a diluted HF solution in water, or EKC 265 would provide a wet etch that would remove the side walls 428 without damaging the OSG layer.

In a specific example of a plasma etch that would strip the patterned resist mask without stripping the sidewalls, the wafer may be placed in an Exelan HP made by LAM Research™. The Exelan HP uses parallel plate electrodes to energize a plasma and confinement rings to confine the plasma to a small volume. The Exelan HP may have a first power source, which provides a 2 MHz output and a second power source with a 27 MHz output. In case of Exelan HP both the RF sources are connected to the lower electrode and the upper electrode is grounded. Different combinations of connecting RF power to the electrode are possible. A medium density plasma with an electron density of between $10^{11}$ to $10^9$ electrons per $cm^3$ is provided. More preferably the electron density is about $10^{10}$ $cm^{-3}$.

In an example recipe using $O^2$ as an etchant gas, Table 1 provides a range of parameters that are preferred in such a process.

TABLE 1

| PARAMETERS | BROAD RANGE | PREFERRED RANGE | MORE PREFERRED RANGE |
|---|---|---|---|
| Pressure (mTorr) | 100–2000 | 200–1000 | 300–360 |
| Power from First Power Source (Watts) | 0–600 | 0–300 | 75–125 |
| Power from Second Power Source (Watts) | 50–1200 | 100–600 | 200–300 |
| Flow Rate of $O_2$ (sccm) | 200–6000 | 400–3000 | 900–1100 |
| Flow Rate of $N_2$ (sccm) | 0–1000 | 0–500 | 180–220 |

In an example recipe using $NH_3$ as an etchant gas, Table 2 provides a range of parameters that are preferred in such a process.

TABLE 2

| PARAMETERS | BROAD RANGE | PREFERRED RANGE | MORE PREFERRED RANGE |
|---|---|---|---|
| Pressure (mTorr) | 100–2000 | 200–1000 | 300–400 |
| Power from First Power Source (Watts) | 0–600 | 0–300 | #5o |
| Power from Second Power Source (Watts) | 100–2000 | 200–1000 | 500–700 |
| Flow Rate of $NH_3$ (sccm) | 250–6000 | 500–3000 | IOO0–2000 |
| Flow Rate of $N_2$ (sccm) | 0–600 | 0–300 | <Ioo |

In an example recipe using $N_2/H_2$ as etchant gases, Table 3 provides a range of parameters that are preferred in such a process.

TABLE 3

| PARAMETERS | BROAD RANGE | PREFERRED RANGE | MORE PREFERRED RANGE |
|---|---|---|---|
| Pressure (mTorr) | 100–2000 | 200–1000 | 400–540 |
| Power from First Power Source (Watts) | 50–2000 | 100–1000 | 300–500 |
| Power from Second Power Source (Watts) | 50–2000 | 100–1000 | 300–500 |
| Flow Rate of $H_2$ (sccm) | 100–2000 | 200–1000 | 500–700 |
| Flow Rate of $N_2$ (sccm) | 250–6000 | 500–3000 | 1800–2000 |

Another embodiment of the invention may use a combined resist strip and barrier layer etch process as described in U.S. patent application Ser. No. 09/746,894 entitled "A Combined Resist Strip And Barrier Etch Process For Dual Damascene Structures" by Rao Anapragada and Reza Sadjadi, with the same filing date, and which is incorporated by reference. A wet stripping would then be used to remove sidewalls.

The etching of a stack using an ammonium and fluorine containing gas as for a plasma source is described in U.S. patent application Ser. No. 09/746,900 entitled "Method of Etching With $NH_3$ AND Fluorine Chemistries" by Rao Anapragada and Reza Sadjadi, with the same filing date, and which is incorporated by reference.

While this invention has been described in terms of several preferred embodiments, there are alterations, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A method of making an etched organo-silicate-glass (OSG) layer over a substrate, comprising:

placing an OSG layer over a substrate;

placing a patterned resist mask over the OSG layer;

etching the OSG layer, wherein the etching of the OSG layer forms at least one opening in the OSG layer and sidewall within the at least one opening;

plasma stripping the patterned resist mask, wherein the plasma stripping does not strip the sidewalls; and wet stripping the sidewalls subsequent to plasma stripping the patterned resist mask.

2. The method, as recited in claim 1, further comprising placing an antireflective coating between the OSG layer and the substrate.

3. The method, as recited in claim 2, wherein the plasma stripping the patterned resist mask, comprises:

providing an etchant case without a fluorocarbon component; and exciting the etchant gas to create a medium density plasma.

4. The method, as recited in claim 3, wherein the plasma stripping the patterned resist mask, further comprises using the side wall to protect OSG layer from plasma during the entire plasma stripping.

5. The method, as recited in claim 4, wherein the wet stripping, comprises placing the substrate in a wet bath.

6. The method, as recited in claim 5, wherein the wet bath is selected from the group consisting of an HF solution and an EKC 265 solution.

7. The method, as recited in claim 6, wherein the etchant gas is selected from the group consisting of $O_2$, $N_2$, $H_2$, and $NH_3$.

8. The method, as recited in claim 1, wherein the wet stripping, comprises placing the substrate in a wet bath.

9. The method, as recited in claim 8, wherein the wet bath is selected from the group consisting of an HF solution and an EKC 265 solution.

10. The method, as recited in claim 1, wherein the etchant gas is selected from the group consisting of $O_2$, $N_2$, $H_2$, and $NH_3$.

11. The method, as recited in claim 1, wherein the etchant gas does not have any fluorocarbon.

12. An etched organo-silicate-glass (OSG) layer manufactured by the process comprising:

placing an OSG layer over a substrate;

placing a patterned resist mask over the OSG layer;

etching the OSG layer, wherein the etching of the OSG layer forms at least one opening in the OSG layer and sidewall within the at least one opening;

plasma stripping the patterned resist mask without stripping the sidewalls; and wet stripping the sidewalls subsequent to plasma stripping the patterned resist mask.

13. The etched organo-silicate-glass layer, as recited in claim 12, wherein the plasma stripping the patterned resist mask, comprises:

providing an etchant case without a fluorocarbon component; and exciting the etchant gas to create a medium density plasma.

14. The etched organo-silicate-glass layer, as recited in claim 13, wherein the plasma stripping does not strip the sidewalls.

15. The etched organo-silicate-glass layer, as recited in claim 12, wherein the wet stripping, comprises placing the substrate in a wet bath.

16. The etched organo-silicate-glass layer, as recited in claim 15, wherein the wet bath is selected from the group consisting of an HF solution and an EKC 265 solution.

17. The etched organo-silicate-glass layer, as recited in claim 12, wherein the etchant gas is selected from the group consisting of $O_2$, $N_2$, $H_2$, and $NH_3$.

18. The etched organo-silicate-glass layer, as recited in claim 7, wherein the etchant gas does not have any fluorocarbon.

* * * * *